(12) United States Patent
Pang

(10) Patent No.: US 11,307,053 B2
(45) Date of Patent: Apr. 19, 2022

(54) DEVICE WITH POSITION DETECTION

(71) Applicant: Samsung Electro-Mechanics Co., Ltd., Suwon-si (KR)

(72) Inventor: Sung Man Pang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 36 days.

(21) Appl. No.: 16/884,880

(22) Filed: May 27, 2020

(65) Prior Publication Data

US 2021/0239493 A1 Aug. 5, 2021

(30) Foreign Application Priority Data

Feb. 4, 2020 (KR) .................. 10-2020-0013123

(51) Int. Cl.
| | | |
|---|---|---|
| *G01D 5/14* | (2006.01) | |
| *G03B 17/02* | (2021.01) | |
| *G01R 33/07* | (2006.01) | |
| *H04N 5/232* | (2006.01) | |
| *G02B 7/04* | (2021.01) | |

(52) U.S. Cl.
CPC ............. *G01D 5/145* (2013.01); *G01R 33/07* (2013.01); *G02B 7/04* (2013.01); *G03B 17/02* (2013.01); *H04N 5/232* (2013.01)

(58) Field of Classification Search
CPC ....... G02B 7/023; G01D 5/145; H04N 5/2254
See application file for complete search history.

(56) References Cited

U.S. PATENT DOCUMENTS

| | | |
|---|---|---|
| 2005/0258825 A1 | 11/2005 | Masuda et al. |
| 2009/0177436 A1 | 7/2009 | Yoshida et al. |
| 2015/0112634 A1* | 4/2015 | Shimizu ................. G01D 3/036 |
| | | 702/151 |
| 2019/0141219 A1* | 5/2019 | Oh ....................... H04N 5/2254 |

FOREIGN PATENT DOCUMENTS

| | | |
|---|---|---|
| CN | 102236769 A | 11/2011 |
| JP | 2002-229090 A | 8/2002 |
| JP | 2005-157721 A | 6/2005 |
| JP | 2005-331399 A | 12/2005 |
| JP | 2010-15107 A | 1/2010 |
| JP | 4760737 B2 | 8/2011 |
| JP | 5715023 B2 | 5/2015 |
| KR | 10-1057951 B1 | 8/2011 |
| KR | 10-1737514 B1 | 5/2017 |

* cited by examiner

*Primary Examiner* — Noam Reisner
(74) *Attorney, Agent, or Firm* — NSIP Law

(57) ABSTRACT

A device with position detection includes: a first hall element; a second hall element; a differential amplifier configured to generate a subtraction voltage by differentially amplifying a first hall voltage generated by the first hall element and a second hall voltage generated by the second hall element; a summing amplifier configured to generate a sum voltage by summatively amplifying the first and second hall voltages; a comparer configured to compare a reference voltage with the subtraction voltage to generate an error voltage; and a current converter configured to generate a bias current provided to the first and second hall elements, based on the error voltage, wherein the device is configured to detect a position of a detection object based on the sum voltage.

17 Claims, 4 Drawing Sheets

DEVICE WITH POSITION DETECTION

CROSS-REFERENCE TO RELATED APPLICATIONS

This application claims the benefit under 35 U.S.C. § 119(a) of Korean Patent Application No. 10-2020-0013123 filed on Feb. 4, 2020 in the Korean Intellectual Property Office, the entire disclosure of which is incorporated herein by reference for all purposes.

BACKGROUND

The following description relates to a device with position detection (or position detecting device).

Generally, portable communications terminals such as mobile phones, personal digital assistants (PDAs), portable personal computers (PCs), and the like, have been designed to transmit text data or voice data and to also transmit image data. Accordingly, a camera module has been installed in a portable communication terminal to allow for the transmission of image data and to enable a video chat function.

Recently, camera modules have been provided with actuators having an autofocusing (AF) function and optical image stabilization (OIS) actuators for an OIS function to decrease resolution reduction due to shaking.

Further, a camera module may include an aperture module for adjusting an amount of light incident to a lens barrel, as well as iris actuators for moving an iris to a target position.

The above-mentioned AF actuators, OIS actuators and IRIS actuators can detect a current position of a detection object through a hall element. A hall voltage of the hall element, however, varies as temperature changes. Thus, it may be necessary to compensate for changes in hall voltage caused by changes in temperature to accurately detect a position of the detection object.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a device with position detection includes: a first hall element; a second hall element; a differential amplifier configured to generate a subtraction voltage by differentially amplifying a first hall voltage generated by the first hall element and a second hall voltage generated by the second hall element; a summing amplifier configured to generate a sum voltage by summatively amplifying the first and second hall voltages; a comparer configured to compare a reference voltage with the subtraction voltage to generate an error voltage; and a current converter configured to generate a bias current provided to the first and second hall elements, based on the error voltage, wherein the device is configured to detect a position of a detection object based on the sum voltage.

The sum voltage may satisfy:

$$Vsum = Vref * \frac{G*A*S*(M1+M2)}{1+G*A*S(M1-M2)},$$

wherein Vsum is the sum voltage, Vref is the reference voltage, G is a voltage-current conversion gain of the current converter, A is an amplification gain of the differential and summing amplifiers, S is a magnetic field sensitivity, M1 is a magnetic field of the first hall element, and M2 is a magnetic field of the second hall element.

The sum voltage, the reference voltage, the voltage-current conversion gain, the amplification gain, the magnetic field sensitivity, the magnetic field of the first hall element, and the magnetic field of the second hall element may satisfy:

$$\frac{1}{G*A*S} \ll M1-M2.$$

The sum voltage, the reference voltage, the voltage-current conversion gain, the amplification gain, the magnetic field sensitivity, the magnetic field of the first hall element, and the magnetic field of the second hall element may satisfy:

$$\frac{1}{100} \leq \frac{1}{G*A*S*(M1-M2)} \leq \frac{1}{10000}.$$

The sum voltage may be determined based on a ratio of a difference between the magnetic field of the first hall element and the magnetic field of the second hall element to a sum of the magnetic field of the first hall element and the magnetic field of the second hall element.

The comparer may be configured to differentiate the reference voltage from the subtraction voltage.

A magnetic field sensitivity of the first hall element and a magnetic field sensitivity of the second hall element may be equal.

Amplification gains of the differential and summing amplifiers may be equal.

In another general aspect, a device with position detection includes: a first hall element; a second hall element; a differential amplifier configured to apply an amplification gain to a first hall voltage generated by the first hall element and a second hall voltage generated by the second hall element to generate a subtraction voltage; a summing amplifier configured to apply the amplification gain to the first and second hall voltages to generate a sum voltage; a comparer configured to compare a reference voltage with the subtraction voltage to generate an error voltage; and a current converter configured to apply a voltage-current conversion gain to the error voltage to generate a bias current provided to the first and second hall elements based on the error voltage, wherein the voltage-current conversion gain and the amplification gain are determined based on magnetic fields of the first and second hall elements.

The sum voltage may satisfy:

$$Vsum = Vref * \frac{G*A*S*(M1+M2)}{1+G*A*S*(M1-M2)},$$

wherein Vsum is the sum voltage, Vref is the reference voltage, G is a voltage-current conversion gain of the current converter, A is the amplification gain, S: magnetic field sensitivity, M1: magnetic field of first hall element, M2: magnetic field of second hall element.

The sum voltage, the reference voltage, the voltage-current conversion gain, the amplification gain, the magnetic field sensitivity, the magnetic field of the first hall element, and the magnetic field of the second hall element may satisfy:

$$\frac{1}{G*A*S} \ll M1 - M2.$$

The sum voltage, the reference voltage, the voltage-current conversion gain, the amplification gain, the magnetic field sensitivity, the magnetic field of the first hall element, and the magnetic field of the second hall element may satisfy:

$$\frac{1}{100} \le \frac{1}{G*A*S*(M1-M2)} \le \frac{1}{10000}.$$

The sum voltage may be determined based on a ratio of a difference between the magnetic field of the first hall element and the magnetic field of the second hall element to a sum of the magnetic field of the first hall element and the magnetic field of the second hall element.

The comparer may be configured to differentiate the reference voltage from the subtraction voltage.

A magnetic field sensitivity of the first hall element and a magnetic field sensitivity of the second hall element may be equal.

In another general aspect, a camera module includes: a lens barrel; an aperture module coupled to the lens barrel and including an aperture configured to control an amount of light incident to the lens barrel; a coil; a magnet configured to move together with either one of the lens barrel and a component setting an opening size of the aperture; a driver configured to configured to apply a driving signal to the coil to cause the magnet to move based on electromagnetic interaction between the coil and the magnet; and a position detecting device. The position detecting device includes: a first hall element; a second hall element; a differential amplifier configured to generate a subtraction voltage by differentially amplifying a first hall voltage generated by the first hall element and a second hall voltage generated by the second hall element; a summing amplifier configured to generate a sum voltage by summatively amplifying the first and second hall voltages; a comparer configured to compare a reference voltage with the subtraction voltage to generate an error voltage; and a current converter configured to generate a bias current provided to the first and second hall elements, based on the error voltage, wherein the position detecting device is configured to detect a position of the magnet based on the sum voltage.

The position detecting device may be further configured to generate a feedback signal based on the sum voltage. The driver may be further configured to generate the driving signal based on the feedback signal and an input signal indicating a target position of the magnet.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
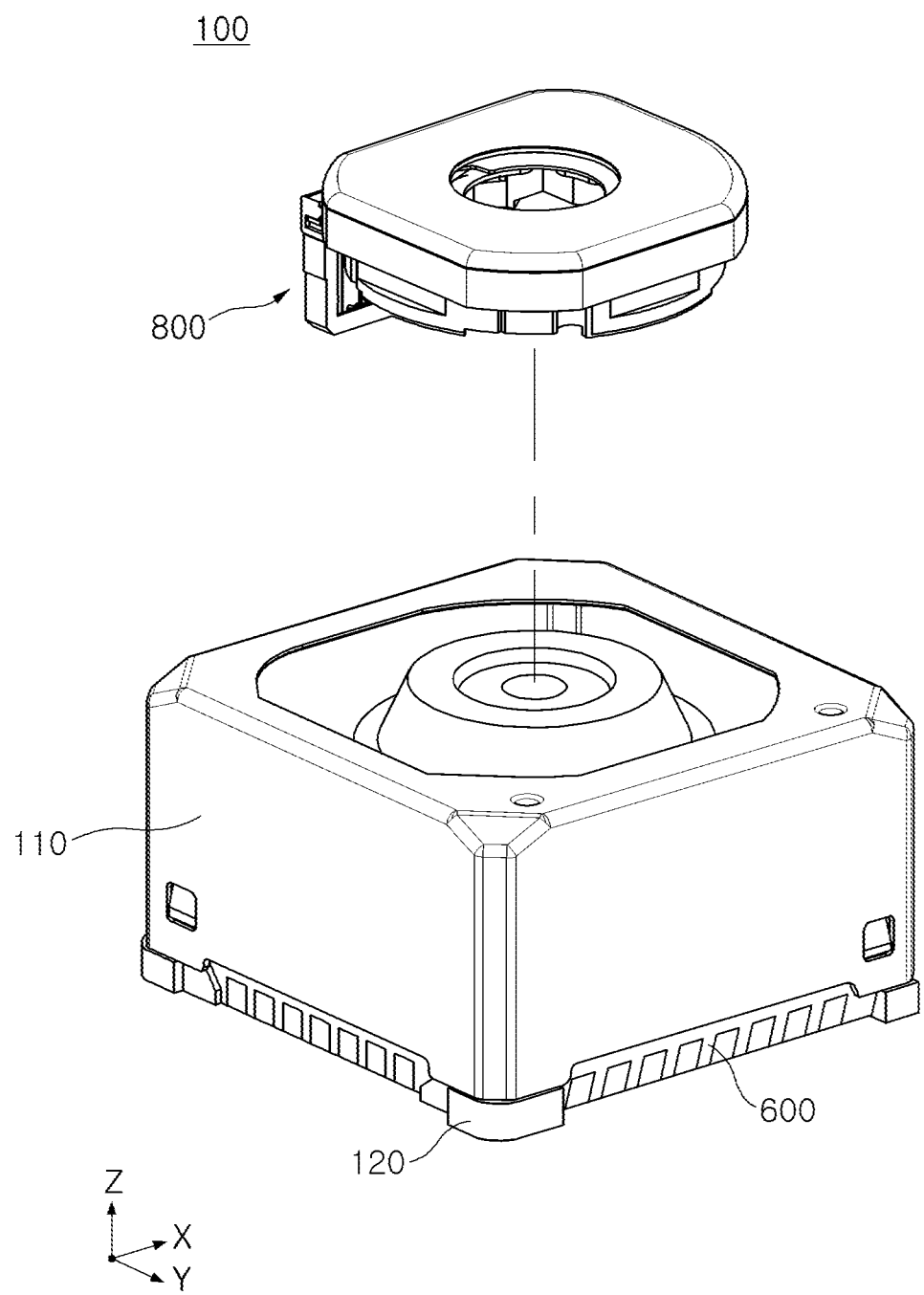
FIG. 1 is a perspective diagram illustrating a camera module, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," "lower," "front," "rear," and "side" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. For another example, if the device in the figures is turned around, an element described as being "front" relative to another element will then be "rear" relative to the other element. Thus, the term "front" encompasses both the front and rear orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
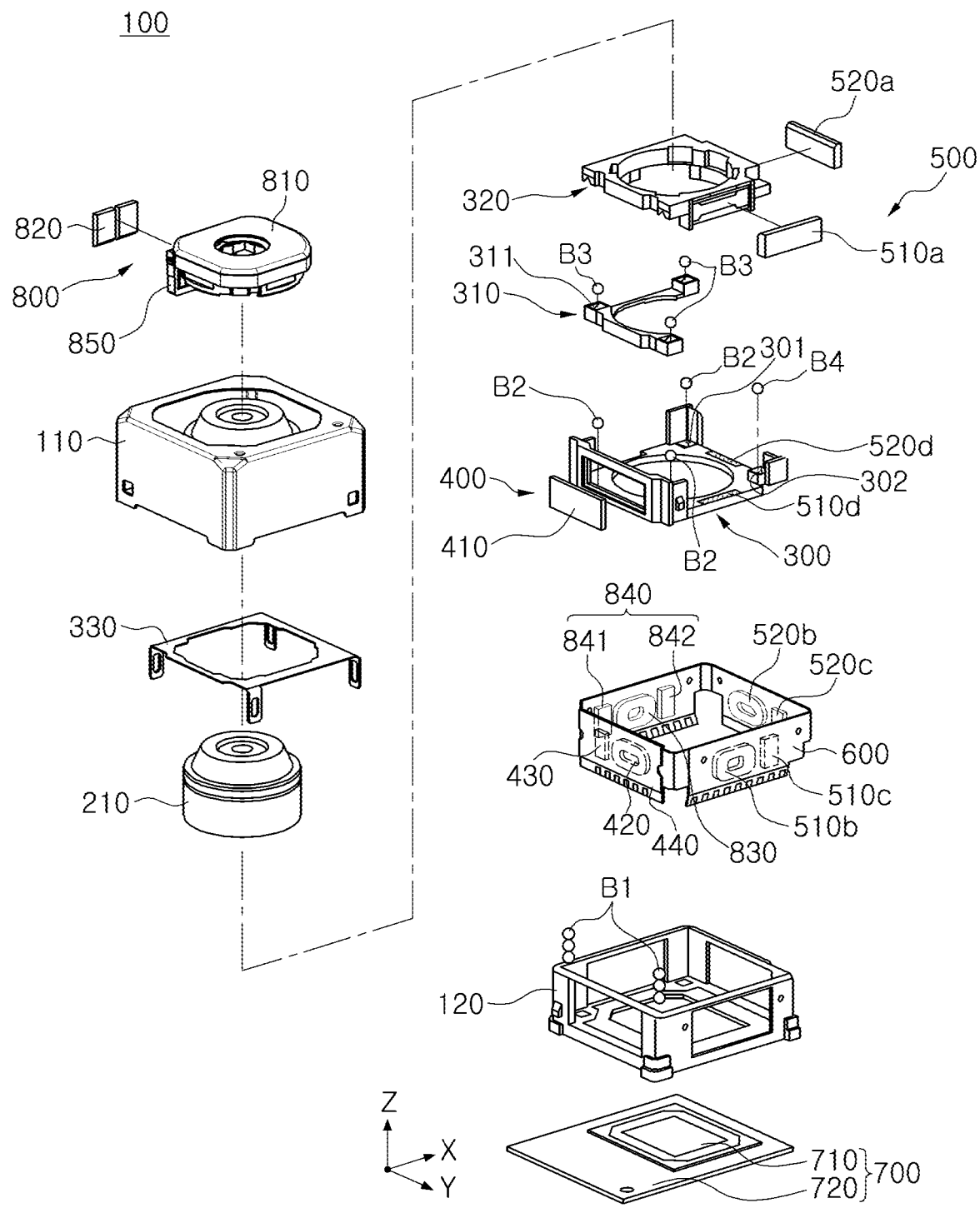
FIG. 2 is an exploded perspective diagram illustrating the camera module of FIG. 1, according to an embodiment.

FIG. 1 is a perspective diagram illustrating a camera module 100, according to an embodiment. FIG. 2 is an exploded perspective diagram illustrating the camera module 100.

Referring to FIGS. 1 and 2, the camera module 100 may include a lens barrel 210, an actuator configured to move the lens barrel 210, a case 110 configured to accommodate the lens barrel 210 and the actuator, a housing 120, an image sensor module 700 configured to convert light incident through the lens barrel 210 into an electrical signal, and an aperture module 800 configured to adjust an amount of light incident to the lens barrel 210.

The lens barrel 210 may have a hollow cylindrical shape such that a plurality of lenses for imaging an object may be accommodated in the lens barrel 210, and one or more lenses among the plurality of lenses may be mounted on the lens barrel 210 along an optical axis. The plurality of lenses may include a desired number of lenses, and the lenses may have the same refractive index and the same optical properties, or may have different refractive indices and different optical properties.

The actuator may move the lens barrel 210. As an example, the actuator may adjust a focus by moving the lens barrel 210 in a direction of an optical axis (Z axis), and the actuator may perform an image-shake correction function when an object is imaged by moving the lens barrel 210 in a direction perpendicular to the optical axis (Z axis). The actuator may include a focus adjustment unit 400 for adjusting a focus and a shake correction unit 500 for correcting the shaking of an image.

The image sensor module 700 may convert light incident through the lens barrel 210 into an electrical signal. As an example, the image sensor module 700 may include an image sensor 710 and a printed circuit board 720 connected to the image sensor 710. The sensor module 700 may further include an infrared filter. The infrared filter may block infrared light of light incident through the lens barrel 210. The image sensor 710 may convert light incident through the lens barrel 210 into an electrical signal. As an example, the image sensor 710 may include a charge coupled device (CCD) or a complementary metal-oxide semiconductor (CMOS). An electrical signal converted by the image sensor 710 may be output as an image through a display unit of a portable electronic device. The image sensor 710 may be fixed to the printed circuit board 720 and may be electrically connected to the printed circuit board 720 by a wire bonding.

The lens barrel 210 and the actuator may be accommodated in the housing 120. As an example, an upper portion and a lower portion of the housing 120 may be configured to be open, and the lens barrel 210 and the actuator may be accommodated in the housing 120. The image sensor module 700 may be disposed below the housing 120.

The case 110 may be coupled to the housing 120 to enclose an external surface of the housing 120 and may protect internal components of the camera module 100. The case 110 may also shield electromagnetic waves. The case 110 may be formed of a metal material and may be grounded to a ground pad provided in the printed circuit board 720, and, thus, may shield electromagnetic waves.

In the embodiment of FIGS. 1 and 2, the actuator may move the lens barrel 210 to focus on an object. As an example, the actuator may include a focus adjustment unit 400 configured to move the lens barrel 210 in the direction of the optical axis (Z axis).

The focus adjustment unit 400 may include a magnet 410 configured to generate driving force to move the lens barrel 210 and a carrier 300 in which the lens barrel 210 is accommodated in the direction of the optical axis (Z axis), and a coil 420.

The magnet 410 may be mounted on the carrier 300. As an example, the magnet 410 may be mounted on a first side of the carrier 300. The coil 420 may be mounted on the housing 120 and may oppose the magnet 410. As an example, the coil 420 may be disposed on a first side of a substrate 600, and the substrate 600 may be mounted on the housing 120.

The magnet 410 may move in the direction of the optical axis (Z axis) together with the carrier 300, and the coil 420 may be fixed to the housing 120. In other embodiments, the positions of the magnet 410 and the coil 420 may be exchanged with each other.

When a driving signal is applied to the coil 420, the carrier 300 may move in the direction of the optical axis (Z axis) due to electromagnetic interaction between the magnet 410 and the coil 420.

The lens barrel 210 may be accommodated in the carrier 300, and the lens barrel 210 may also move in the direction of the optical axis (Z axis) as the carrier 300 moves. A frame 310 and a lens holder 320 may also be accommodated in the carrier 300, and the frame 310, the lens holder 320, and the lens barrel 210 may move in the direction of the optical axis (Z axis) together as the carrier 300 moves.

A rolling member B1 may be disposed between the carrier 300 and the housing 120 to reduce fraction between the carrier 300 and the housing 120 when the carrier 300 moves. The rolling member B1 may have a form of a ball. Multiple rolling members B1 may be disposed on both sides of the magnet 410.

A yoke 440 may be disposed in the housing 120. As an example, the yoke 440 may be mounted on the substrate 600 and may be disposed in the housing 120. The yoke 440 may be arranged on a surface of the first side of the substrate 600 that is opposite a surface on which the coil 420 is disposed. Accordingly, the yoke 440 may oppose the magnet 410 with the coil 420 interposed therebetween. Attractive force may work between the yoke 440 and the magnet 410 in a direction perpendicular to the optical axis (Z axis). By the attractive force between the yoke 440 and the magnet 410, the rolling member B1 may maintain a state of contact with the carrier 300 and the housing 120. Further, the yoke 440 may collect magnetic force of the magnet 410 and may prevent leakage flux. As an example, the yoke 440 and the magnet 410 may form a magnetic circuit.

In the example embodiment, in the process of adjusting a focus, a closed-loop control method of sensing a position of the lens barrel 210 and providing a feedback may be used. Accordingly, the AF actuator may include a position detecting device for performing the closed-loop control method. As an example, the position detecting device may include an AF hall element 430. A flux value detected from the AF hall element 430 may change in accordance with the movement of the magnet 410 opposing the AF hall element 430. The position detecting device may detect a position of the lens barrel 210 based on changes in flux value of the AF hall element 430 caused by the movement of the magnet 410 in the direction of the optical axis (Z axis).

The OIS actuator 500 may be used to correct the blurring of an image or the shaking of a video caused by a factor such as shaking of a user's hand when an image or a video is obtained. For example, when the image shakes due to the shaking of a user's hand while an image is obtained, the OIS actuator 500 may provide a relative displacement corresponding the shaking to the lens barrel 210 to correct the shaking. As an example, the OIS actuator 500 may correct the shaking by moving the lens barrel 210 in the direction perpendicular to the optical axis (Z axis).

The OIS actuator 500 may include a plurality of magnets 510a and 520a configured to generate driving force for moving a guiding member in the direction perpendicular to the optical axis (Z axis), and a plurality of coils 510b and 520b. The frame 310 and the lens holder 320 may be inserted into the carrier 300. The frame 310 and the lens holder 320 may be disposed along the optical axis (Z axis) and may guide the movement of the lens barrel 210. The frame 310 and the lens holder 320 may include a space into which the lens barrel 210 is inserted. The lens barrel 210 may be inserted into and fixed to the lens holder 320.

The frame 310 and the lens holder 320 may move in the direction perpendicular to the optical axis (Z axis) with respect to the carrier 300 by driving force generated by magnetic interaction between the plurality of magnets 510a and 520a and the plurality of coils 510b and 520b. Among the plurality of magnets 510a and 520a and a plurality of coils 510b and 520b, the first magnet 510a may be disposed on a second side of the lens holder 320, and the first coil 510b may be disposed on a second side of the substrate 600, such that the first magnetic 510a and the first coil 510b may generate driving force in a direction of a first axis (Y axis) perpendicular to the optical axis (Z axis). In addition, the second magnet 520a may be disposed on a third side of the lens holder 320 and the second coil 520b may be disposed on a third side of the substrate 600, such that the second magnet 520a and the second coil 520b may generate driving force in a direction of a second axis (X axis) perpendicular to the first axis (Y axis). The second axis (X axis) may be an axis perpendicular to the optical axis (Z axis) and the first axis (Y axis). The coils 510b and 520b may be configured to be orthogonal to each other on a planar surface perpendicular to the optical axis (Z axis).

The plurality of magnets 510a and 520a may be mounted on the lens holder 320, and the plurality of coils 510b and 520b opposing the plurality of magnets 510a and 520a may be disposed on the substrate 600 and may be mounted on the housing 120.

The plurality of magnets 510a and 520a may move in a direction perpendicular to the optical axis (Z axis) along with the lens holder 320, and the plurality of coils 510b and 520b may be fixed to the housing 120. In other embodiments, positions of the plurality of magnets 510a and 520a and the plurality of coils 510b and 520b may be changed with each other.

In the process of shake correction, a closed-loop control method of sensing a position of the lens barrel 210 and providing a feedback may be used. Accordingly, the OIS actuator 500 may include a position detecting device for the closed-loop control. The position detecting device may include OIS hall elements 510c and 520c. The OIS hall elements 510c and 520c may be disposed on the substrate 600 and may be mounted on the housing 120. The OIS hall elements 510c and 520c may oppose a plurality of the magnets 510a and 520a in the direction perpendicular to the optical axis (Z axis). As an example, the first OIS hall element 510c may be disposed on the second side of the substrate 600, and the second OIS hall element 520c may be disposed on the third side of the substrate 600.

Flux values of the OIS hall elements 510c and 520c may change in accordance with the movement of the magnets 510a and 520a opposing the OIS hall elements 510c and 520c. The position detecting device may detect a position of the lens barrel 210 based on changes in flux values of the OIS hall elements 510c and 520c caused by the movement of the magnets 510a and 520a in two directions (Z axis and Y axis directions) perpendicular to the optical axis.

The camera module 100 may include a plurality of ball members supporting the OIS actuator 500. The plurality of ball members may be configured to guide the movements of the frame 310, the lens holder 320, and the lens barrel 210, and also to maintain gaps among the carrier 300, the frame 310, and the lens holder 320.

The plurality of the ball members may include a first ball member B2 and a second ball member B3. The first ball member B2 may guide the movements of the frame 310, the lens holder 320, and the lens barrel 210 in the direction of the first axis (Y axis), and the second ball member B3 may guide the movements of the lens holder 320 and the lens barrel 210 in the direction of the second axis (X axis).

As an example, when driving force acting in the direction of the first axis (Y axis) occurs, the first ball member B2 may roll in the direction of the first axis (Y axis). Accordingly, the first ball member B2 may guide the movements of the frame 310, the lens holder 320, and the lens barrel 210 in the direction of the first axis (Y axis). Further, when driving force acting in the direction of the second axis (X axis) occurs, the second ball member B3 may roll in the direction of the second axis (X axis). Accordingly, the second ball member B3 may guide the movements of the lens holder 320 and the lens barrel 210 in the direction of the second axis (X axis).

A plurality of first ball members B2 may be disposed between the carrier 300 and the frame 310, and a plurality of second ball members B3 may be disposed between the frame 310 and the lens holder 320.

A first guide groove portion 301 configured to accommodate the first ball member B2 may be disposed on each of a surface of the carrier 300 and a surface of the frame 310 that oppose each other in the direction of the optical axis (Z axis). The first guide groove portion 301 may include a plurality of guide grooves corresponding to the plurality of first ball members B2. The first ball member B2 may be accommodated in the frame 310 and may be interposed between the carrier 300 and the frame 310. Movement of the first ball member B2 in the directions of the optical axis (Z axis) and the second axis (X axis) may be prevented while the first ball member B2 is accommodated in the first guide groove portion 301, and the first ball member B2 may move only in the direction of the first axis (Y axis). As an example, the first ball member B2 may only roll in the direction of the first axis (Y axis). To this end, a planar surface of each of a plurality of the guide grooves of the first guide groove portion 301 may have a rectangular shape having a length in the direction of the first axis (Y axis).

A second guide groove portion 311 configured to accommodate the second ball member B3 may be formed in each of surfaces of the frame 310 and the lens holder 320 opposing each other in the direction of the optical axis (Z axis). The second guide groove portion 311 may include a plurality of guide grooves corresponding to the plurality of second ball members B3.

The second ball member B3 may be accommodated in the second guide groove portion 311 and may be interposed between the frame 310 and the lens holder 320. Movement of the second ball member B3 in the directions of the optical axis (Z axis) and the first axis (Y axis) may be prevented while the second ball member B3 is accommodated in the second guide groove portion 311, and the second ball member B3 may only move in the direction of the second axis (X axis). As an example, the second ball member B3 may only roll in the direction of the second axis (X axis). To this end, a planar surface of each of a plurality of the guide grooves of the second guide groove portion 311 may have a rectangular shape having a length in the direction of the second axis (X axis).

A third ball member B4 configured to support the movement of the lens holder 320 between the carrier 300 and the lens holder 320 may be provided. The third ball member B4 may guide the movements of the lens holder 320 in the directions of the first axis (Y axis) and the second axis (X axis).

As an example, the third ball member B4 may roll in the direction of the first axis (Y axis) when driving force occurs in the direction of the first axis (Y axis). Accordingly, the third ball member B4 may guide the movement of the lens holder 320 in the direction of the first axis (Y axis).

Further, the third ball member B4 may roll in the second axis (X axis) when driving force occurs in the direction of the second axis (X axis). Accordingly, the third ball member B4 may guide the movement of the lens holder 320 in the second axis (X axis). The second ball member B3 and the third ball member B4 may be in contact with and may support the lens holder 320.

A third guide groove portion 302 for accommodating the third ball member B4 may be formed on each of surfaces of the carrier 300 and the lens holder 320 opposing each other in the direction of the optical axis (Z axis). The third ball member B4 may be accommodated in the third guide groove portion 302 and may be interposed between the carrier 300 and the lens holder 320. The movement of the third ball member B4 in the direction of the optical axis (Z axis) may be prevented while the third ball member B4 is accommodated in the third guide groove portion 302, and the third ball member B4 may roll only in the directions of the first axis (Y axis) and the second axis (X axis). To this end, a planar surface of the third guide groove portion 302 may have a circular shape. Thus, the planar surfaces of the first guide groove portion 301, the second guide groove portion 311, and the third guide groove portion 302 may have different shapes.

As described above, the first ball member B2 may roll in the direction of the first axis (Y axis), the second ball member B3 may roll in the direction of the second axis (X axis), and the third ball member B4 may roll in the directions of the first axis (Y axis) and the second axis (X axis).

When driving force acting in the direction of the first axis (Y axis) occurs, the frame 310, the lens holder 320, and the lens barrel 210 may move in the direction of the first axis (Y axis). The first ball member B2 and the third ball member B4 may roll in the direction of the first axis (Y axis). The movement of the second ball member B3 may be prevented.

When driving force acting in the direction of the second axis (X axis) occurs, the lens holder 320 and the lens barrel 210 may move in the direction of the second axis (X axis). The second ball member B3 and the third ball member B4 may roll in the direction of the second axis (X axis). The movement of the first ball member B2 may be prevented.

In the embodiment of FIGS. 1 and 2, a plurality of yokes 510d and 520d may be provided such that contact may be maintained between the OIS actuator 500 and the first to third ball members B2 to B4. The plurality of yokes 510d and 520d may be fixed to the carrier 300 and may oppose the plurality of magnets 510a and 520a, respectively, in the direction of the optical axis (Z axis). Accordingly, attractive force may occur between the plurality of yokes 510d and 520d and the plurality of magnets 510a and 520a, respectively. By the respective attractive force between the plurality of yokes 510d and 520d and the plurality of magnets 510a and 520a, the OIS actuator 500 may be pressured in a direction of the plurality of yokes 510d and 520d, and accordingly, the frame 310 and the lens holder 320 of the OIS actuator 500 may maintain a state of contact with the first to third ball members B2 to B4. The plurality of yokes 510d and 520d may be formed of a material which may generate attractive force between the plurality of yokes 510d and 520d and the plurality of magnets 510a and 520a, respectively. As an example, the plurality of yokes 510d and 520d may be formed of a magnetic material.

In the example described herein, the plurality of yokes 510d and 520d may be provided such that the frame 310 and the lens holder 320 may maintain a state of contact with the first to third ball members B2 to B4, and a stopper 330 may be provided to prevent the first to third ball members B2 to B4, the frame 310, and the lens holder 320 from being detached from the carrier 300. The stopper 330 may be coupled to the carrier 300 to cover at least a portion of an upper surface of the lens holder 320.

The aperture module 800 may include, for example, an aperture 810, a magnet 820, a coil 830, a hall element 840, and a substrate 850. The magnet 820, the coil 830 and the hall element 840 may constitute an IRIS actuator of the aperture module 800.

The aperture 810 of the aperture module 800 may be coupled to the lens barrel 210 through an upper portion of the case 110. As an example, the aperture 810 may be mounted on the lens holder 320 to which the lens barrel 210 is fixedly inserted and may be coupled to the lens barrel 210. Accordingly, the aperture 810 may move along with the lens barrel 210 and the lens holder 320.

The magnet 820 may be arranged on one side of the aperture 810. As an example, the magnet 820 may be mounted on the substrate 850, which is arranged on one side of the aperture 810, and thus may be disposed on the one side of the aperture 810. The magnet 820 may be arranged on one side of the aperture 810 and may be disposed on a fourth side of the lens holder 320. As an example, the magnet 820 may include two magnetic materials polarized differently from each other.

The substrate 850 may be coupled to the aperture 810 to be enabled to move in the direction of the first axis (Y axis). The substrate 850 may include a connection member which may be inserted into the aperture 810 and may move in the direction of the first axis (Y axis) such that the substrate 850 may be coupled to the aperture 810 to move in the direction of the first axis (Y axis). A diameter of an incident hole of an upper portion of the aperture 810 may change according to a degree of insertion of the connection member of the substrate 850, that is, a length of the substrate 850 and the aperture 810 in the direction of the first axis (Y axis) such that an amount of light incident through the aperture 810 may be determined.

The coil 830 may be disposed on a fourth side of the substrate 600 to oppose the magnet 820. The coil 830 may generate driving force in the direction of the first axis (Y axis). When driving force occurs in the direction of the first axis (Y axis) by the magnet 820 and the coil 830, distances of the magnet 820 and the coil 830 taken in the direction of the first axis (Y axis) may change.

The hall element 840 may oppose the magnet 820 on the fourth side of the substrate 600. The hall element 840 may include a first hall element 841 and a second hall element 842 disposed with the coil 830 interposed therebetween. A flux value of the hall element 840 may change according to the movement of the magnet 820. A position of the magnet 820 may be detected from a flux value of the hall element 840.

Figure 3:
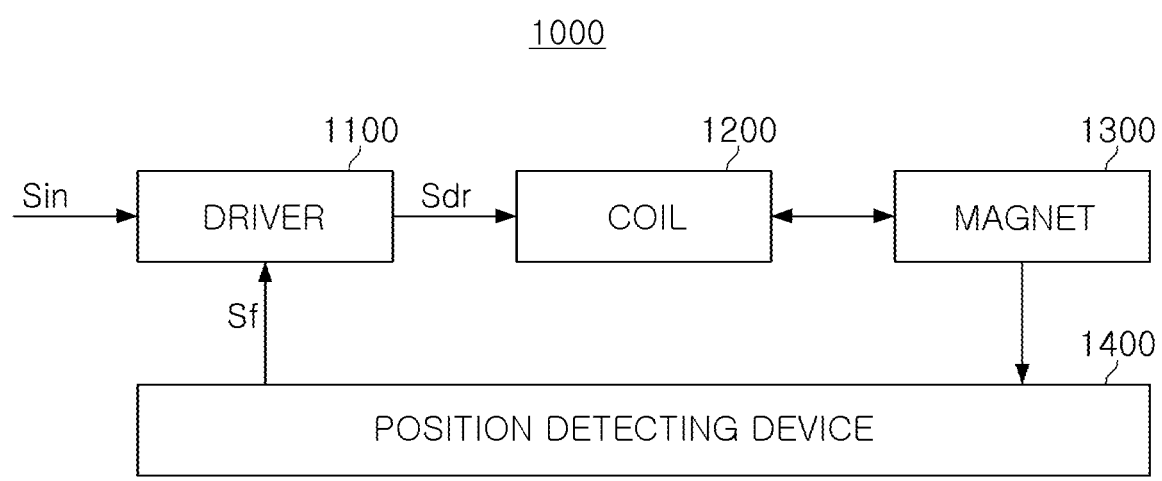
FIG. 3 is a block diagram illustrating an actuator employed in a camera module, according to an embodiment.

FIG. 3 is a block diagram illustrating an actuator 1000 employed in a camera module, according to an embodiment.

The actuator 1000 may include, for example, a driver 1100, a coil 1200, a magnet 1300, and a position detecting device 1400. The actuator 1000 according to the example embodiment of FIG. 3 may correspond to any one of the AF actuator, the OIS actuator and the IRIS actuator illustrated in FIGS. 1 and 2.

The driver 1100 may generate a driving signal Sdr according to an input signal Sin applied from an external entity and a feedback signal sf generated by the position detecting device 1400 and may provide the generated driving signal Sdr to the coil 1200. As an example, the input signal Sin may be applied in an electronic device employing a camera module and provided by a host controlling an overall operation of the electronic device. The input signal Sin provided to the driver 1100 may include information on a target position of the magnet.

When the driving signal Sdr provided from the driver 1100 is applied to the coil 1200, a diameter of an aperture may be determined by electromagnetic interaction between the coil 1200 and the magnet 1300.

The position detecting device 1400 may detect a position of the magnet 1300 moving by electromagnetic interaction between the coil 1200 and the magnet 1300, and may generate the feedback signal sf and provide the feedback signal sf to the driver 1100. As an example, the position detecting device 1400 may include a hall element for detecting a flux value.

When the feedback signal sf is provided to the driver 1100, the driver 1100 may compare the input signal Sin with the feedback signal sf and may generate the driving signal Sdr again. Accordingly, the driver 1100 may be driven based on a closed-loop type to compare the input signal Sin with the feedback signal sf. The closed-loop type driver 1100 may be driven in a direction of reducing an error between a target position of the magnet 1300 included in the input signal Sin and a current position of the magnet 1300 included in the feedback signal sf. The driving based on the closed-loop method may have improved linearity, accuracy, and repeatability as compared to an open-loop method.

Figure 4:
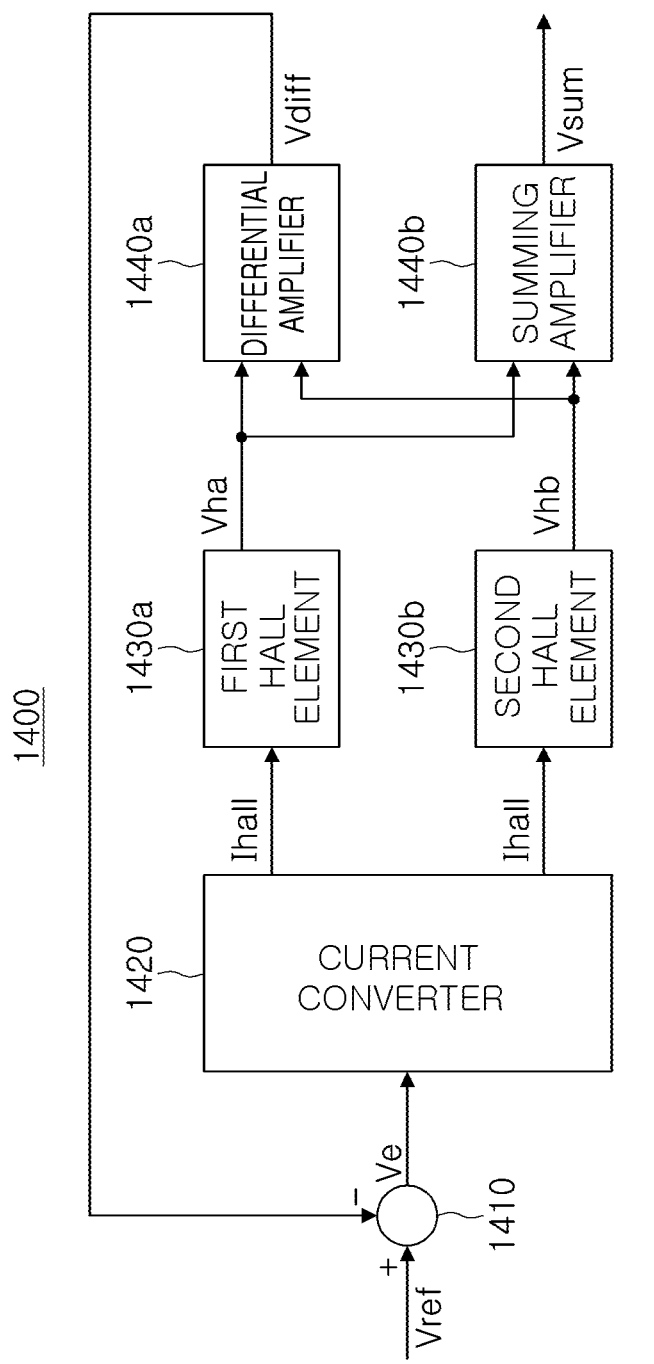
FIG. 4 is a block diagram illustrating a position detecting device, according to an embodiment.

FIG. 4 is a block diagram illustrating the position detecting device 1400, according to an example embodiment.

Referring to FIG. 4, the position detecting device 1400 may include, for example, a comparer 1410, a current converter 1420, a first hall element 1430a, a second hall element 1430b, a differential amplifier 1440a, and a summing amplifier 1440b.

For example, the comparer 1410 compares a reference voltage Vref with a subtraction voltage Vdiff to generate an error voltage Ve. As an example, the error voltage Ve corresponds to a voltage obtained by subtracting the subtraction voltage Vdiff from the reference voltage. The reference voltage Vref input into the comparison unit 1410 may correspond to a voltage predetermined for the operations of the first and second hall elements 1430a and 1430b.

The current-converter 1420 may apply a voltage-current conversion gain G to the error voltage Ve provided from the comparison unit 1410 to generate a bias current Ihall (Ihall=G*(Vref−Vdiff)) and provide the generated bias current Ihall to the first and second hall elements 1430a and 1430b. The voltage-current conversion gain G may be transconductance corresponding to a gain of an output current based on an input voltage.

When the bias current Ihall is applied to the first hall element 1430a, the first hall element 1430a generates a first hall voltage Vha, and when the bias current Ihall is applied to the second hall element 1430b, the second hall element 1430b generates a second hall voltage Vhb.

The differential amplifier 1440a may differentially amplify the first hall voltage Vha and the second hall voltage Vhb to output the subtraction voltage Vdiff. For example, the differential amplifier 1440a may apply an amplification gain A to the first hall voltage Vha generated by the first hall element and a second hall voltage generated by the second hall element to output a subtraction voltage Vdiff (Vdiff=A*(Vha−Vhb)).

The summing amplifier 1440b may summatively, or additively, amplify the first hall voltage Vha and the second hall voltage Vhb to output a sum voltage Vsum. Specifically, the summing amplifier 1440b may apply the amplification gain A to the first and second hall voltages Vha and Vhb to output the sum voltage Vsum (Vsum=A*(Vha+Vhb)). As an example, an amplification gain A of the differential amplifier 1440a and that of the summing amplifier 1440b may be equal.

The position detecting device 1400 may use the sum voltage Vsum output from the summing amplifier 1440b as a feedback signal Sf of FIG. 3. That is, the position detecting device 1400 may detect a position of a magnet corresponding to a detection object depending on the sum voltage Vsum.

In consideration of the subtraction voltage Vdiff fed back to the comparison unit 140, the bias current Ihall may be represented by Equation 1 below:

$$Ihall = G*(Vref - A*(Vha - Vhb)). \quad \text{Equation 1}$$

Since the first hall element Vha is represented by a product of a magnetic field sensitivity S, the bias current Ihall, and a magnetic field M1 of the first hall element 1430*a*, and the second hall voltage Vhb is represented by a product of a magnetic field sensitivity S, the bias current Ihall, and a magnetic field M2 of the second hall element 1430*b*, the bias current Ihall may be represented by Equation 2. As an example, the magnetic field sensitivity S of the first hall element 1430*a* and that of the second hall voltage Vhb may be equal:

$$Ihall = G*(Vref - A*S*Ihall*(M1 - M2)) \quad \text{Equation 2}$$
$$Ihall = Vref * \frac{G}{1 + G*A*S*(B1 - B2)}.$$

Further, since the first hall element Vha is represented by the product of the magnetic field sensitivity S, the bias current Ihall, and the magnetic field M1 of the first hall element 1430*a*, and the second hall voltage Vhb is represented by the product of the magnetic field sensitivity S, the bias current Ihall and the magnetic field M2 of the second hall element 1430*b*, the sum voltage Vsum may be represented by Equation 3:

$$Vsum = A*S*Ihall*(M1 + M2). \quad \text{Equation 3}$$

When the bias current Ihall of Equation 2 is substituted into Equation 3, Equation 3 may be expressed as Equation 4:

$$Vsum = Vref * \frac{G*A*S*(M1 + M2)}{1 + G*A*S*(M1 - M2)}. \quad \text{Equation 4}$$

In Equation 4, a value of 1/(G*A*S) may be significantly smaller than that of M1−M2 (1/(G*A*S)<<M1−M2). When the value of 1/(G*A*S) is significantly smaller than that of M1−M2, Equation 4 may be expressed as Equation 5. As an example, a ratio of (M1−M2) to (1/(G*A*S)) may be 1/100 to 1/0000.

$$Vsum = Vref * \frac{(M1 + M2)}{(M1 - M2)}. \quad \text{Equation 5}$$

Based on Equation 5, the sum voltage Vsum may be determined depending on a ratio of a sum of the magnetic fields M1 and M2 of the first and second hall elements 1430*a* and 1430*b*, respectively, to a difference between the magnetic fields M1 and M2 of the first and second hall elements 1430*a* and 1430*b*, respectively.

In Equation 4, (M1−M2) is a fixed value depending on a position relation between the first and second hall elements 1430*a* and 1430*b*, while the magnetic field sensitivity S is a value fixed as a characteristic value of each of the first and second hall elements 1430*a* and 1430*b*.

Accordingly, the position detecting device 1400 may determine the voltage-current conversion gain G of the current-conversion unit 1420 and the amplification gains A of the differential and summing amplifiers 1440*a* and 1440*b* depending on the magnetic fields M1 and M2 of the first and second hall elements 1430*a* and 1430*b*, respectively, while setting the value of 1/(G*A*S) to be significantly smaller than that of M1−M2.

As an example, in order for the ratio of (M1−M2) to (1/(G*A*S)) to satisfy 1/100 to 1/0000, the position detecting device 1400 adjusts the voltage-current conversion gain G and the amplification gains A when the value of M1−M2 is significantly small. In contrast, when the value of M1−M2 is relatively large, the voltage-current conversion gain G and the amplification gains A are adjusted such that the sum voltage Vsum represented by Equation 5 is calculated with high accuracy.

In Equation 5, the reference voltage Vref may be appropriately varied so that the sum voltage Vsum, as a parameter irrelevant to the position relation of the first and second hall elements 1430*a* and 1430*b* or the temperature of environment, lies within a certain range.

According to an example, due to the reference voltage Vref being appropriately adjusted for the sum voltage Vsum to be in a certain range, an input range of an analog-digital converter ADC digital-converting the sum voltage may be defined, and thus, manufacturing costs of the ADCs may be reduced.

In Equation 5, when the magnetic fields M1 and M2 of the first and second hall elements 1430*a* and 1430*b* are affected by a temperature coefficient T, the sum voltage Vsum may be represented by Equation 6 below:

$$Vsum = Vref * \frac{T*(M1 + M2)}{T*(M1 - M2)}. \quad \text{Equation 6}$$

Based on Equation 6, even when the magnetic fields M1 and M2 of the first and second hall elements 1430*a* and 1430*b* are affected by the temperature coefficient T, the temperature coefficient T is canceled out. Thus, according to an example, the position detecting device 1400 provides the sum voltage as a feedback signal Sf, thereby eliminating the variations of the hall voltage depending on temperature changes.

A position detecting device according to embodiments disclosed herein may compensate for variations in a hall voltage due to temperature changes.

The driver 1100, the comparer 1410, and the current converter 1420 in FIGS. 3 and 4 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 3 and 4 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. In addition, respective embodiments may be combined with each other. For example, the pressing members disclosed in the above-described embodiments may be used in combination with each other in one force sensing device. Therefore, the scope of the disclosure is defined not by the detailed description, but by the claims and their equivalents, and all variations within the scope of the claims and their equivalents are to be construed as being included in the disclosure.

What is claimed is:
1. A device with position detection, comprising:
a first hall element;
a second hall element;
a differential amplifier configured to generate a subtraction voltage by applying an amplification gain to differentially amplify a first hall voltage generated by the first hall element and a second hall voltage generated by the second hall element;

a summing amplifier configured to generate a sum voltage by applying the amplification gain to summatively amplify the first and second hall voltages;

a comparer configured to compare a reference voltage with the subtraction voltage to generate an error voltage; and a current converter configured to generate a bias current provided to the first and second hall elements, by applying a voltage-conversion gain to the error voltage, wherein the voltage-current conversion gain and the amplification gain are determined based on a magnetic field of the first hall element and a magnetic field of the second hall element, and wherein the device is configured to detect a position of a detection object based on the sum voltage.

2. The device of claim 1, wherein the sum voltage satisfies:

$$Vsum = Vref * \frac{G*A*S*(M1+M2)}{1+G*A*S*(M1-M2)},$$

wherein Vsum is the sum voltage, Vref is the reference voltage, G is a voltage-current conversion gain of the current converter, A is the amplification gain, S is a magnetic field sensitivity, M1 is the magnetic field of the first hall element, and M2 is the magnetic field of the second hall element.

3. The device of claim 2, wherein the sum voltage, the reference voltage, the voltage-current conversion gain, the amplification gain, the magnetic field sensitivity, the magnetic field of the first hall element, and the magnetic field of the second hall element satisfy:

$$\frac{1}{G*A*S} \ll M1-M2.$$

4. The device of claim 3, wherein the sum voltage, the reference voltage, the voltage-current conversion gain, the amplification gain, the magnetic field sensitivity, the magnetic field of the first hall element, and the magnetic field of the second hall element satisfy:

$$\frac{1}{100} \leq \frac{1}{G*A*S*(M1-M2)} \leq \frac{1}{10000}.$$

5. The device of claim 3, wherein the sum voltage is determined based on a ratio of a difference between the magnetic field of the first hall element and the magnetic field of the second hall element to a sum of the magnetic field of the first hall element and the magnetic field of the second hall element.

6. The device of claim 1, wherein the comparer is configured to differentiate the reference voltage from the subtraction voltage.

7. The device of claim 1, wherein a magnetic field sensitivity of the first hall element and a magnetic field sensitivity of the second hall element are equal.

8. The device of claim 1, wherein amplification gains of the differential and summing amplifiers are equal.

9. A device with position detection, comprising:
a first hall element;
a second hall element;
a differential amplifier configured to apply an amplification gain to a first hall voltage generated by the first hall element and a second hall voltage generated by the second hall element to generate a subtraction voltage;
a summing amplifier configured to apply the amplification gain to the first and second hall voltages to generate a sum voltage;
a comparer configured to compare a reference voltage with the subtraction voltage to generate an error voltage; and
a current converter configured to apply a voltage-current conversion gain to the error voltage to generate a bias current provided to the first and second hall elements based on the error voltage,
wherein the voltage-current conversion gain and the amplification gain are determined based on a magnetic field of the first hall element and a magnetic field of the second hall element.

10. The device of claim 9, wherein the sum voltage satisfies:

$$Vsum = Vref * \frac{G*A*S*(M1+M2)}{1+G*A*S*(M1-M2)},$$

wherein Vsum is the sum voltage, Vref is the reference voltage, G is a voltage-current conversion gain of the current converter, A is the amplification gain, S is a magnetic field sensitivity, M1 is the magnetic field of the first hall element, M2 is the magnetic field of the second hall element.

11. The position detecting device of claim 10, wherein the sum voltage, the reference voltage, the voltage-current conversion gain, the amplification gain, the magnetic field sensitivity, the magnetic field of the first hall element, and the magnetic field of the second hall element satisfy:

$$\frac{1}{G*A*S} \ll M1-M2.$$

12. The device of claim 11, wherein the sum voltage, the reference voltage, the voltage-current conversion gain, the amplification gain, the magnetic field sensitivity, the magnetic field of the first hall element, and the magnetic field of the second hall element satisfy:

$$\frac{1}{100} \leq \frac{1}{G*A*S*(M1-M2)} \leq \frac{1}{10000}.$$

13. The device of claim 11, wherein the sum voltage is determined based on a ratio of a difference between the magnetic field of the first hall element and the magnetic field of the second hall element to a sum of the magnetic field of the first hall element and the magnetic field of the second hall element.

14. The device of claim 9, wherein the comparer is configured to differentiate the reference voltage from the subtraction voltage.

15. The device of claim 9, wherein a magnetic field sensitivity of the first hall element and a magnetic field sensitivity of the second hall element are equal.

16. A camera module, comprising:
a lens barrel;

an aperture module coupled to the lens barrel and comprising an aperture configured to control an amount of light incident to the lens barrel;
a coil;
a magnet configured to move together with either one of the lens barrel and a component setting an opening size of the aperture;
a driver configured to configured to apply a driving signal to the coil to cause the magnet to move based on electromagnetic interaction between the coil and the magnet; and
a position detecting device comprising:
  a first hall element;
  a second hall element;
  a differential amplifier configured to generate a subtraction voltage by applying an amplification gain to differentially amplify a first hall voltage generated by the first hall element and a second hall voltage generated by the second hall element;
  a summing amplifier configured to generate a sum voltage by applying the amplification gain to summatively amplify the first and second hall voltages;
  a comparer configured to compare a reference voltage with the subtraction voltage to generate an error voltage; and
  a current converter configured to generate a bias current provided to the first and second hall elements, by applying a voltage-conversion gain to the error voltage,
wherein the voltage-current conversion gain and the amplification gain are determined based on a magnetic field of the first hall element and a magnetic field of the second hall element, and
wherein the position detecting device is configured to detect a position of the magnet based on the sum voltage.

17. The camera module of claim 16, wherein the position detecting device is further configured to generate a feedback signal based on the sum voltage, and
wherein the driver is further configured to generate the driving signal based on the feedback signal and an input signal indicating a target position of the magnet.

* * * * *